(12) United States Patent
Nakamura

(10) Patent No.: US 8,743,084 B2
(45) Date of Patent: Jun. 3, 2014

(54) INPUT APPARATUS

(75) Inventor: Naoki Nakamura, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 193 days.

(21) Appl. No.: 13/283,476

(22) Filed: Oct. 27, 2011

(65) Prior Publication Data

US 2012/0105369 A1    May 3, 2012

(30) Foreign Application Priority Data

Oct. 28, 2010 (JP) ................................. 2010-241841

(51) Int. Cl.
*G06F 3/044* (2006.01)

(52) U.S. Cl.
USPC ........................................................ 345/174

(58) Field of Classification Search
USPC .................... 345/173–174; 178/18.03–19.03
See application file for complete search history.

(56) References Cited

U.S. PATENT DOCUMENTS

| | | | | |
|---|---|---|---|---|
| 2006/0097992 A1* | 5/2006 | Gitzinger et al. | ............. | 345/173 |
| 2007/0046637 A1* | 3/2007 | Choo et al. | ................... | 345/169 |
| 2007/0074913 A1* | 4/2007 | Geaghan et al. | ........... | 178/18.06 |
| 2009/0207152 A1* | 8/2009 | Nakamura | ..................... | 345/174 |
| 2010/0123677 A1* | 5/2010 | Brown et al. | ................. | 345/174 |
| 2010/0245290 A1 | 9/2010 | Iio et al. | | |
| 2011/0001722 A1* | 1/2011 | Newman et al. | .............. | 345/174 |
| 2011/0005845 A1* | 1/2011 | Hotelling et al. | .......... | 178/18.06 |
| 2011/0037728 A1* | 2/2011 | Gourlay | ........................ | 345/174 |

FOREIGN PATENT DOCUMENTS

JP    2008-052583 A    3/2008

* cited by examiner

*Primary Examiner* — Hong Zhou
(74) *Attorney, Agent, or Firm* — Kilpatrick Townsend & Stockton LLP

(57) ABSTRACT

An input apparatus includes a base material facing the outside and configured to serve as an operation surface of the input apparatus; a substrate arranged so as to be on the inner side, i.e., the opposite side to the operation surface of the input apparatus, and so as to face the base material; at least one first pad arranged on the substrate so as to face the base material via a dielectric member and configured to detect a capacitance; at least one second pad arranged on the substrate so as to face the base material with an air layer therebetween and configured to detect a capacitance; and a control section connected to the first and second pads, and configured to control the first and second pads.

8 Claims, 4 Drawing Sheets

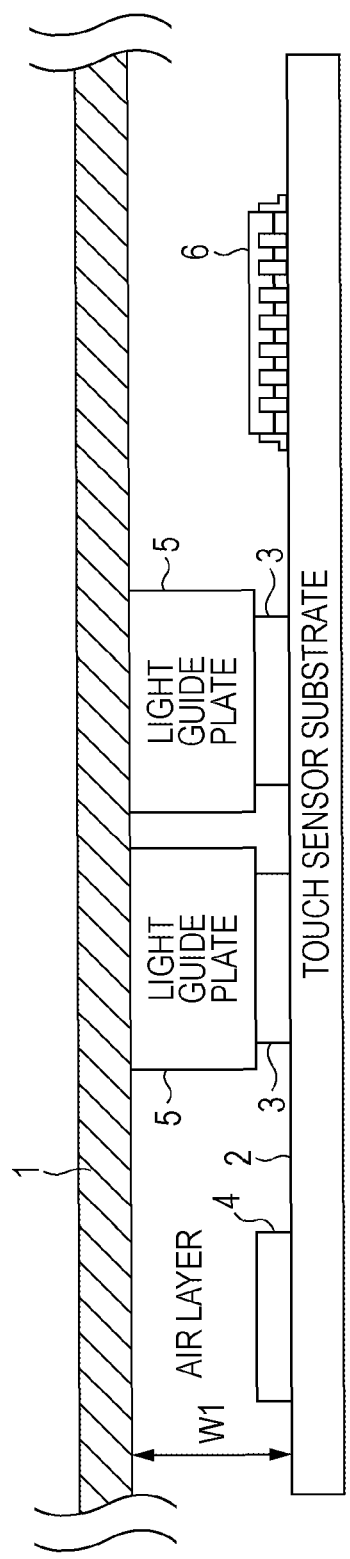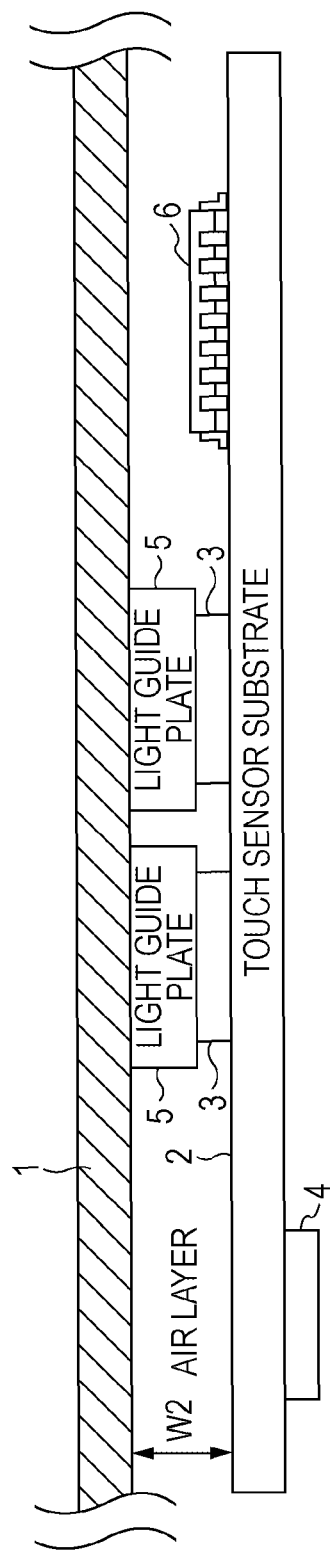

INPUT APPARATUS

CROSS REFERENCES TO RELATED APPLICATIONS

The entire disclosure of Japanese Patent Application No. 2010-241841, filed Oct. 28, 2010 is expressly incorporated by reference herein.

BACKGROUND

1. Technical Field

The present invention relates to an input apparatus having a capacitive touch sensor.

2. Related Art

There is known a capacitive touch sensor (types thereof including a touch panel, a touch pad, and a touch switch) that detects a touch of a user's finger by detecting a change in capacitance (for example, see JP-A-2008-52583). This type of touch sensor is used for, for example, an operation panel of the housing of an electronic device, and allows the electronic device to be operated, as an input apparatus which receives a user's manual input.

Specifically, the touch sensor includes, for example, a pad configured to detect and output a capacitance; and a controller (e.g., a control IC) configured to detect a change in the capacitance outputted from the pad and to output the detected change to a CPU or the like. For example, the controller converts a signal outputted from the pad into a CPU processable signal (for example, a value indicating an electric potential, or a frequency), and outputs the CPU processable signal.

The characteristics of individual electronic devices, pads and controllers vary depending on the model. Accordingly, when a minute change in capacitance is detected, the characteristics of an individual device have a significant influence on the detected change, thus a variation occurs in the values measured by respective controllers of electronic devices.

In order to prevent a malfunction of the electronic device such as an inability to detect a touch due to the occurrence of a variation, a touch sensor, after being attached to the electronic device, is adjusted in the process of manufacturing the electronic device. In the adjustment of the touch sensor, an output value of the pad is measured, for example, in a state (OFF state) where a user's finger or other object is not close to or in contact with a pad, and a correction value (for example, a correction value for adjusting the gain) is calculated, with which the measured value can be corrected to a predetermined reference value (a proper value for determination of the OFF state), and is stored in a nonvolatile memory or the like. Subsequently, correction (for example, the gain adjustment) of the output of the pad is made based on the correction value by the processing of at least one of the control IC and the CPU, so that an appropriate value is measured.

However, in the process of manufacturing electronic devices, a user's finger, a tool, or an other object may approach or come into contact with a pad during the adjustment of a touch sensor, thus an accurate measurement value cannot be obtained properly. Thus, an appropriate correction value cannot be obtained, and consequently, a malfunction of the touch sensor is caused.

SUMMARY

Thus, an advantage of some aspects of the invention is that a touch sensor can be adjusted without being affected by external influences as much as possible.

One aspect of the invention in order to solve the above-mentioned problems is an input apparatus including a base material facing the outside and configured to serve as an operation surface of the input apparatus; a substrate arranged to be on the inner side, i.e., on the opposite side to the operation surface of the input apparatus, and to face the base material; at least one first pad arranged on the substrate so as to face the base material via a dielectric member and configured to detect a capacitance; at least one second pad arranged on the substrate so as to face the base material via an air layer and configured to detect a capacitance; and a control section connected to the first and second pads, and configured to control the first and second pads.

Here, the second pad may be configured to determine a correction value, with which the control section or a CPU connected to the control section adjusts the output of the first pad on the basis of the output of the second pad.

Also, the second pad may be arranged on a surface of the substrate, the surface facing the base material.

Also, the second pad may be arranged on a surface that is on the opposite side to the surface of the substrate that faces the base material.

Also, the dielectric member may be in contact with the base material as well as the first pad.

Also, the second pad may be arranged at a position where a measurement condition for the output of the second pad is worse than in the first pad.

Also, wiring interconnecting the second pad and the control section is longer than wiring interconnecting the first pad and the control section.

Also, the dielectric member is a light guide material configured to guide light from a light source disposed on the substrate to the base material, and a portion of the base material facing the dielectric member allows the light from the light source to be transmitted.

Also, the input apparatus may be any one of a printer, a scanner, a copier, and a multi-functional device.

BRIEF DESCRIPTION OF THE DRAWINGS

FIG. 2 shows the relationship between an electronic device and the touch sensor substrate according to the first embodiment of the invention.

FIG. 3 shows the relationship between an electronic device and a touch sensor substrate according to a variation of the first embodiment of the invention.

DESCRIPTION OF EXEMPLARY EMBODIMENTS

Hereinafter, a first embodiment of the invention is described with reference to the accompanying drawings.

In the present embodiment, an input apparatus having a touch sensor is, for example, an electronic device such as a printer, a scanner, a copier, or a multi-functional device. The electronic device has, for example, on its housing (the outer side of the housing, an operation surface), an operation panel region for a user to perform an input operation to the electronic device. A touch sensor substrate is provided under the operation panel region so as to face the operation panel region (the inner side of the housing, the inside of the electronic device) so that a touch operation by a user on the operation panel region can be detected.

Figure 1:
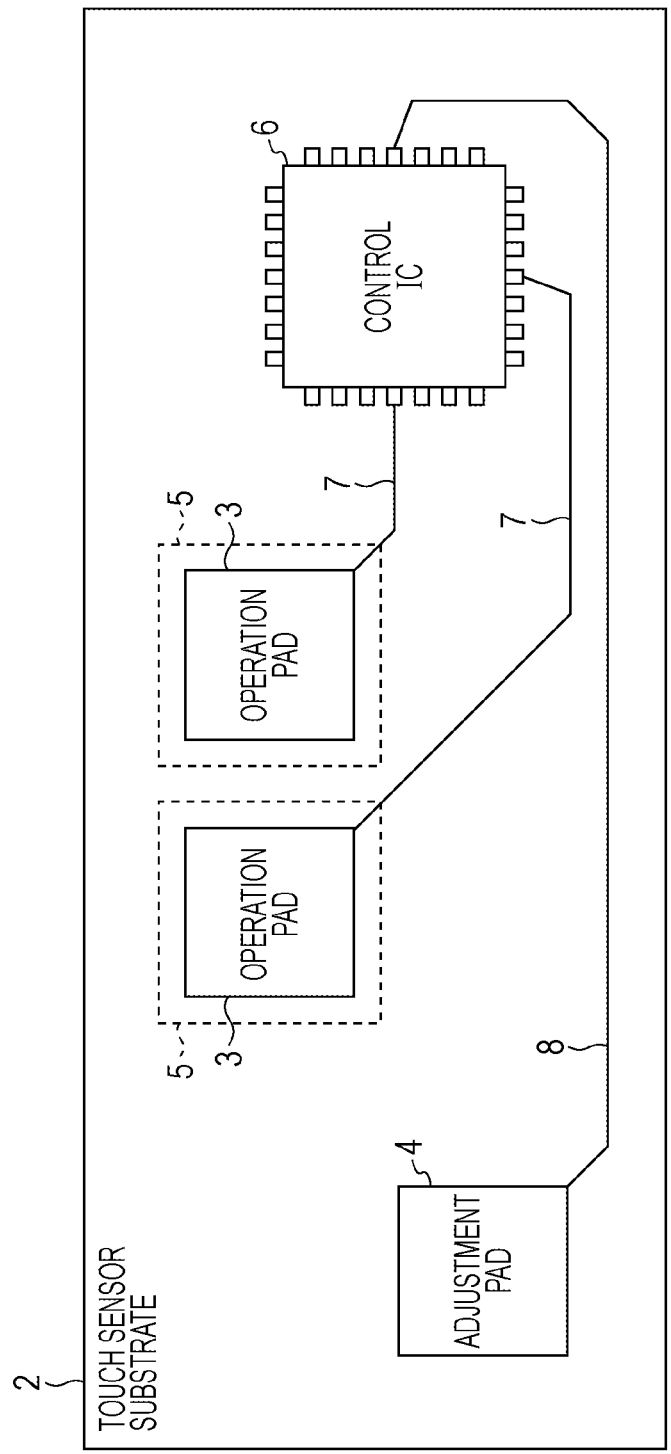
FIG. 1 shows an exemplary schematic configuration of a touch sensor substrate according to a first embodiment of the invention.

FIG. 1 shows an exemplary schematic configuration of a touch sensor substrate according to the first embodiment of the invention. FIG. 1 shows a top view of a touch sensor substrate 2 which is disposed under the above-described operation panel region of the electronic device. FIG. 2 shows the relationship between an electronic device and the touch sensor substrate according to the first embodiment of the invention. FIG. 2 shows a side view of how the touch sensor substrate 2 is disposed inside a housing 1 of the electronic device (the housing 1 is shown as a section).

The touch sensor substrate 2 includes an operation pad 3, an adjustment pad 4, and a control IC 6. The operation pad 3 and the control IC 6 are interconnected by wiring 7. The adjustment pad 4 and the control IC 6 are interconnected by wiring 8.

The operation pad 3 is what is called an electrostatic pad, and includes, for example, an insulating pad, and an electrode disposed below the pad. The operation pad 3 detects an electric charge accumulated due to an approach or contact of a dielectric such as, for example, a user's finger to or with the operation pad 3, and outputs the detected electric charge to the control IC 6 via the wiring 7.

A light guide plate 5 which serves as a dielectric is disposed between the operation pad 3 and the housing 1. The upper end of the light guide plate 5 is made to contact with or is bonded to the housing 1 from the inner side of the housing 1, and the lower end of the light guide plate 5 is made to contact with or is bonded to the upper side of the operation pad 3. A light source (not shown) such as an LED is disposed in the vicinity of the operation pad 3 of the touch sensor substrate 2, and the light guide plate 5 guides the light from the light source to the housing 1. At least a portion of the housing 1, which is made to contact with or bonded to the light guide plate 5, is composed of light transparent material or configured to be light transparent so that a user can identify the location for operation with the light.

With the above-described configuration, the operation pad 3 can detect an electrostatic charge accumulated due to an approach or contact of a user's finger or the like to or with the portion of the housing 1 facing the light guide plate 5. In the embodiment, each of the operation pad 3 and the adjustment pad 4 outputs its capacitance regardless of its state, that is whether a dielectric is close to each pad or not, so that the control IC 6 can acquire a measurement value in each state.

The adjustment pad 4 is, for example, an electrostatic pad of the same product type as the operation pad 3. The adjustment pad 4 detects an electric charge accumulated due to an approach of a dielectric such as a user's finger to the operation pad 3, and outputs the detected electric charge to the control IC 6 via the wiring 8.

The adjustment pad 4 is arranged at a position where the measurement conditions for the output value are worse than those in the operation pad 3. For example, the arrangement of the adjustment pad 4 is such that the current value immediately after the output from the adjustment pad 4 is the same as that immediately after the output from the operation pad 3, but is smaller than that in the operation pad 3 when detected by the control IC 6. In the embodiment, the adjustment pad 4 is arranged so that the length of the wiring 8 is longer than that of the wiring 7.

As described below, a correction value for the gain adjustment is calculated so that the measurement value of the adjustment pad 4 under poor measurement conditions is correctly adjusted, thus by using the correction value, the measurement value of the operation pad 3 is correctly adjusted under better measurement conditions than those for the adjustment pad 4.

The measurement by the adjustment pad 4 is only required to be performed under worse conditions than those for the operation pad 3, thus the method of achieving this requirement is not limited to providing a difference between the two wiring lengths as described above, but may be, for example, providing the adjustment pad 4 with a smaller area than that of the operation pad 3. These methods may be combined. Alternatively, for example, multiple pieces of the adjustment pad 4 may be provided, and the worst value among the values measured by these pieces may be used. For example, in the case where the adjustment pad 4 is arranged at a position where the measurement conditions are the same as those for the operation pad 3, worse measurement conditions may be set for the adjustment pad 4 by making the wiring 8 meander so that the length of the wiring 8 exceeds the length of the wiring 7.

Here, the light guide plate 5 serving as a dielectric is not disposed between the adjustment pad 4 and the housing 1. That is to say, an air layer (air gap) exists between the adjustment pad 4 and the housing 1 so that the effect on the output of the adjustment pad 4 from an approach or contact of the dielectric to or with the surface of the housing 1 is reduced as much as possible. The width (W1) of the air layer is such that the effect on a capacitance from an approach or contact of the dielectric to or with the surface of the housing 1 is reduced as much as possible or eliminated, the capacitance being detected by the adjustment pad 4.

The control IC 6 controls the operation pad 3 and the adjustment pad 4. The control IC 6 measures the output of the adjustment pad 4, for example in the process of manufacturing an electronic device, and converts the output to a CPU processable signal and outputs the signal to a CPU. The control IC 6 also corrects the gain of the operation pad 3 with the correction value set by the CPU. Also, the control IC 6 acquires the corrected measurement value of the operation pad 3, and converts the corrected measurement value to a CPU processable signal and outputs the signal to the CPU.

The touch sensor substrate 2 is connected to, for example, a main controller substrate (not shown) which controls the electronic device. The main controller substrate is provided with, for example, a CPU, a RAM, and/or a ROM. The control IC 6 outputs a measurement value to the CPU. Needless to say, the touch sensor substrate 2 and the main controller substrate may be integrally formed, and each pad and the control IC 6 may be mounted on separate substrates.

The CPU receives a measurement value of the adjustment pad 4 outputted from the control IC 6 by executing a predetermined program, for example, in the manufacturing process, while calculating a correction value, with which the measurement value can be corrected to a predetermined reference value using a predefined conversion formula or conversion table. The correction value is then stored in a ROM or the like.

The above-mentioned correction value is used to correct the output of the operation pad 3. For example, at the time of activation of the electronic device, the CPU sets the correction value in the control IC 6, which corrects the gain of the operation pad 3 with the correction value. The CPU acquires a measurement value, for example, from the operation pad 3 for every predetermined time interval, and calculates the difference between the measurement value obtained at a certain time and the measurement value obtained the predetermined time interval after the certain time. When the difference exceeds a predetermined value, the CPU determines that the operation pad 3 has been touched.

In the embodiment, the correction value is calculated by the CPU, however, the correction value may be calculated, for example, by the control IC 6. In the embodiment, the correction value is set by the control IC 6, however, the CPU may perform the correction rather than the control IC 6, for example.

The configuration of the touch sensor substrate and the electronic device according to the above-described first embodiment of the invention has been described as a basic configuration to explain the features of the invention, and is not limited to the above-described configuration. Also, it is not intended to exclude any configuration which a general touch sensor substrate and an electronic device may have.

So far, the first embodiment of the invention has been described. According to the embodiment, the touch sensor can be adjusted without being affected by external influences as much as possible.

That is to say, in the embodiment, the adjustment pad is provided at a position away from the normal operation area of a user, and is separated from the housing via the air layer. With such a configuration, even in the case where a user's finger or an object approaches or comes into contact with the housing, a capacitance can be detected without being affected by the approach or contact. Consequently, the touch sensor can be adjusted properly.

Figure 4:
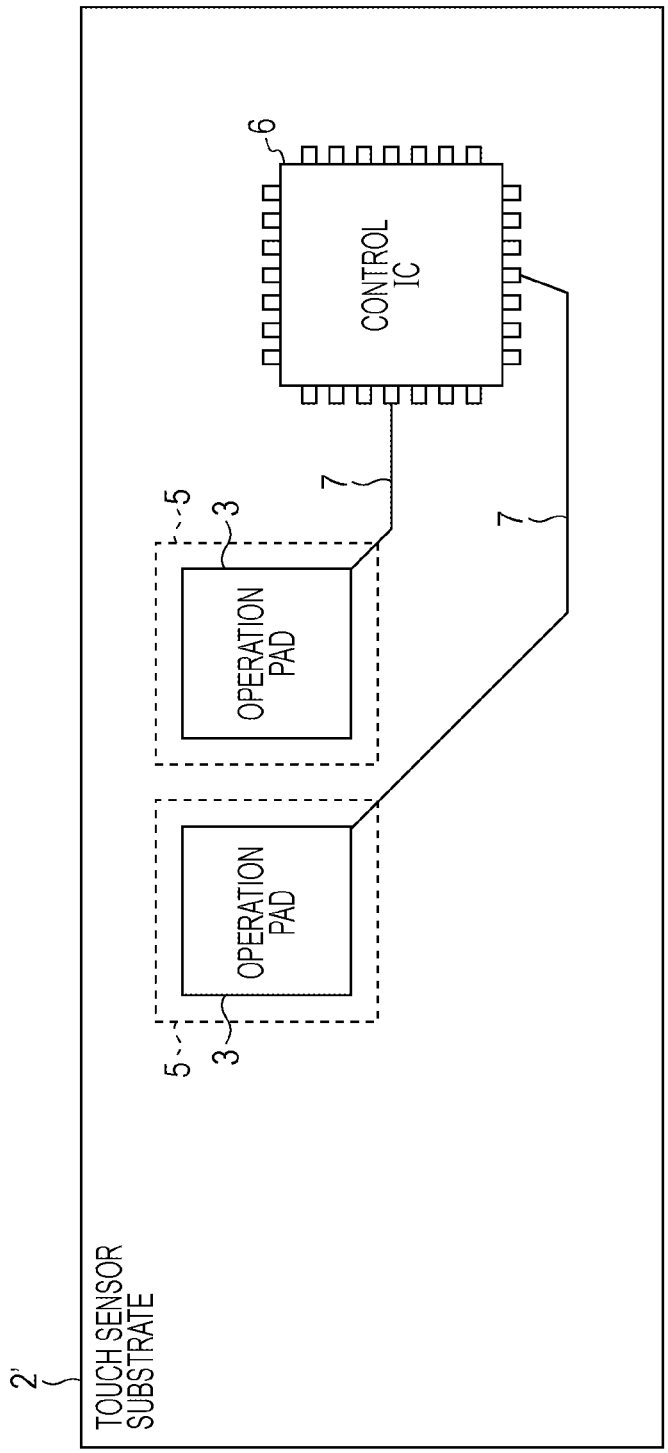
FIG. 4 shows an exemplary schematic configuration of a conventional touch sensor substrate.
Figure 5:
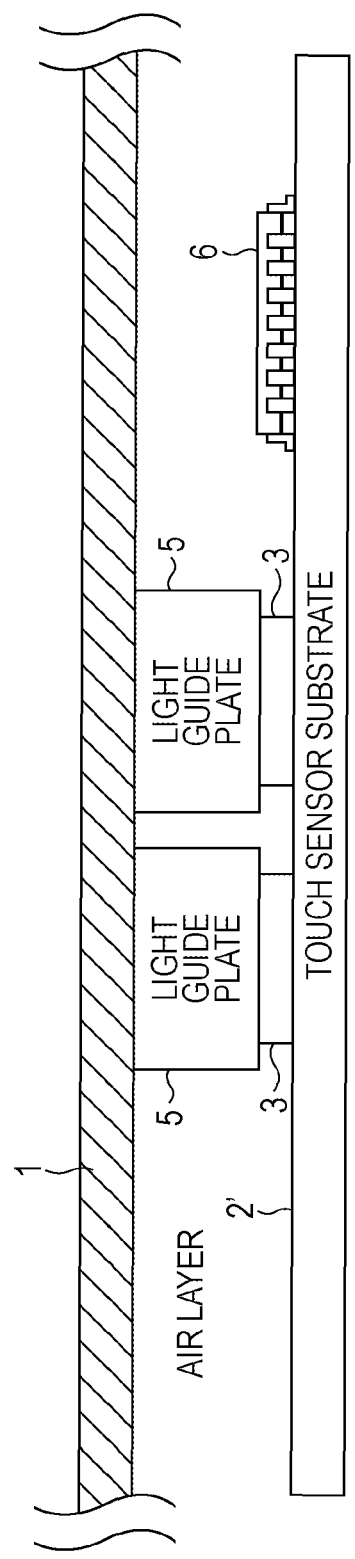
FIG. 5 shows the relationship between an electronic device and a conventional touch sensor substrate.

The above-described embodiment and the related art are compared with each other. As shown in FIGS. 4 and 5, a conventional touch sensor substrate 2' includes the operation pad 3, the control IC 6, and the wiring 7, but does not include the adjustment pad 4 and the wiring 8. The operation pad 3 is made to contact with or is joined to the housing 1 via the light guide plate 5.

Consequently, adjustment of the conventional touch sensor needs to be made using the measurement value of the operation pad 3, thus in the case where a user's finger or an object approaches or comes into contact with the housing 1, an appropriate measurement value cannot be obtained.

Next, a variation of the first embodiment of the invention is described focusing on the aspects of the variation that are different from those of the first embodiment.

FIG. 3 shows the relationship between an electronic device and a touch sensor substrate according to the variation of the first embodiment of the invention.

In the variation, when the touch sensor substrate 2 is housed in the housing 1 of the electronic device, the distance (W2) between the housing 1 and the touch sensor substrate 2 is shorter than the distance (W1) in the first embodiment. Consequently, in the case where the adjustment pad 4 is provided on the surface of the housing, which faces the touch sensor substrate 2, an approach or contact of a user's finger to or with the surface of the housing 1 may cause a change in the capacitance, thus an appropriate measurement value cannot be obtained.

Thus, in the variation, the adjustment pad 4 is installed on the surface of the back side (on the side furthest from the housing 1) of the touch sensor substrate 2. The wiring 8 is also installed on the surface of the back side of the touch sensor substrate 2.

With the above configuration, even in the case where the housing and the touch sensor substrate are close to each other, the touch sensor can be adjusted without being affected by external influences as much as possible.

The above-described embodiments of the invention are intended to illustrate, and not to limit the spirit and scope of the invention. Many alternatives, modifications, and variations will be apparent to those skilled in the art.

In the above-described embodiments, the correction value is determined in the process of manufacturing an electronic device, but may be determined, for example, at the timing when the power of the electronic device is turned on or when a power-saving mode resumes to a normal mode after the electronic device has been purchased by a user.

What is claimed is:

1. An input apparatus comprising:
a base material configured to serve as an operation surface of the input apparatus;
a substrate arranged so as to face the base material;
at least one first pad arranged on the substrate so as to face the base material with a dielectric member therebetween and configured to detect a capacitance;
at least one second pad arranged on the substrate as to face the base material without a dielectric member therebetween and configured to detect a capacitance; and
a control section connected to the first and second pads, and configured to control the first and second pads,
wherein the second pad is configured to determine a correction value, with which the control section or a central processing unit connected to the control section adjusts an output of the first pad on the basis of an output of the second pad.

2. The input apparatus according to claim 1, wherein the second pad is arranged on a surface of the substrate, the surface facing the base material.

3. The input apparatus according to claim 1, wherein the second pad is arranged on a surface of the substrate that is on the opposite side to the surface of the substrate that faces the base material.

4. The input apparatus according to claim 1, wherein the dielectric member is in contact with the base material as well as the first pad.

5. The input apparatus according to claim 1, wherein the second pad is arranged at a position where a measurement condition for an output of the second pad is worse than in the first pad.

6. The input apparatus according to claim 5, wherein wiring interconnecting the second pad and the control section is longer than wiring interconnecting the first pad and the control section.

7. The input apparatus according to claim 1, wherein the dielectric member is a light guide material configured to guide light from a light source disposed on the substrate to the base material, and a portion of the base material facing the dielectric member allows the light from the light source to be transmitted.

8. The input apparatus according to claim 1, wherein the input apparatus is any one of a printer, a scanner, a copier, and a multi-functional device.

* * * * *